United States Patent [19]
MacLeish et al.

[11] Patent Number: 6,113,984
[45] Date of Patent: *Sep. 5, 2000

[54] GAS INJECTION SYSTEM FOR CVD REACTORS

[75] Inventors: Joseph H. MacLeish, San Ramon; Robert D. Mailho, Sonora; Mahesh K. Sanganeria, Sunnyvale; Enrique Suarez del Solar, Oakland, all of Calif.

[73] Assignee: Concept Systems Design, Inc., Fremont, Calif.

[ * ] Notice: This patent is subject to a terminal disclaimer.

[21] Appl. No.: 08/876,967

[22] Filed: Jun. 16, 1997

Related U.S. Application Data

[63] Continuation-in-part of application No. 08/693,721, Aug. 7, 1996, Pat. No. 5,653,808.

[51] Int. Cl.$^7$ .................................................. C23C 16/00
[52] U.S. Cl. .................... 427/255.32; 118/715; 118/725; 156/345
[58] Field of Search .................... 118/715, 719, 118/725, 728; 156/345; 427/255.32

[56] References Cited

U.S. PATENT DOCUMENTS

| | | | |
|---|---|---|---|
| 4,699,805 | 10/1987 | Seelbach et al. | 437/245 |
| 4,924,807 | 5/1990 | Nakayama et al. | 118/725 |
| 5,062,386 | 11/1991 | Christensen | 118/725 |
| 5,238,499 | 8/1993 | Van de Ven et al. | 118/724 |
| 5,264,040 | 11/1993 | Geyling | 118/728 |
| 5,269,847 | 12/1993 | Anderson et al. | 118/715 |
| 5,370,738 | 12/1994 | Watanabe et al. | 118/725 |
| 5,516,367 | 5/1996 | Lei et al. | 118/725 |
| 5,551,982 | 9/1996 | Anderson et al. | 118/715 |
| 5,653,808 | 8/1997 | MacLeish et al. | 118/715 |
| 5,843,233 | 12/1998 | Van de Ven et al. | 118/715 |
| 5,882,417 | 3/1999 | Van de Ven et al. | 118/728 |
| 5,891,251 | 4/1999 | MacLeish et al. | 118/719 |
| 5,916,369 | 6/1999 | Anderson et al. | 118/715 |

*Primary Examiner*—Jeffrie R Lund
*Attorney, Agent, or Firm*—Skjerven, Morrill, MacPherson, Franklin, & Friel, LLP.; Tom Chen

[57] ABSTRACT

A CVD reactor includes separate reaction and pressure chambers, where the reaction chamber is contained within and isolates process or reactant gases from the pressure chamber. The reactor also includes a gas injection system which pre-heats and injects diffused process gas(es) into the reaction chamber in a somewhat vertical direction through a bottom surface of the reaction chamber. The gas injection system injects hydrogen or other appropriate gas in a vertical direction through the bottom surface of the reaction chamber. The flow of hydrogen or other appropriate gas is intermediate the flow of the process gas(es) and a surface of the reaction chamber, thereby re-directing the process gas flow parallel to the top surface of a wafer therein. In this manner, the reaction chamber does not require a long entry length for the process gas(es). This flow of hydrogen or other suitable gas also minimizes undesirable deposition on the surface of the reaction chamber.

22 Claims, 11 Drawing Sheets

GAS INJECTION SYSTEM FOR CVD REACTORS

CROSS-REFERENCE TO RELATED APPLICATIONS

This application is a continuation-in-part of commonly owned U.S. patent application Ser. No. 08/693,721, filed on Aug. 7, 1996, now U.S. Pat. No. 5,653,808, issued of Aug. 5, 1997 and relates to commonly owned U.S. patent application Ser. No. 08/694,001, entitled "CVD REACTOR HAVING HEATED PROCESS CHAMBER WITHIN ISOLATION CHAMBER," filed on Aug. 7, 1996, now U.S. Pat. No. 5,891,251, issued of Apr. 6, 1999.

BACKGROUND

1. Field of the Invention

The present invention relates to a chemical vapor deposition (CVD) process chamber and, specifically, to a single wafer, multi-chamber CVD system.

2. Description of Related Art

A continuing challenge in the fabrication of integrated circuits is to maintain a wafer at a constant and uniform temperature so that various layers (i.e., epitaxial layers, polysilicon layers, etc.) of a uniform thickness and resistivity may be deposited thereon. In a typical radiantly heated "warm" wall CVD reactor, a wafer is placed in a quartz containment vessel. As the vessel and the wafer therein are heated by lamps positioned external to the vessel, process or reactant gases are pumped into the vessel so as to deposit on the wafer.

Warm wall CVD reactors, such as the one described above, have a number of limitations which adversely affect efficiency, reliability, and performance. For single wafer CVD systems, including those tailored to deposit epitaxial and polysilicon layers, throughput is an important consideration. Perhaps the biggest obstacle to improving throughput in such CVD systems is the time required to clean the chamber walls after each wafer is processed. Cleaning the chamber walls in radiantly heated quartz CVD chambers is vital since process gases deposit not only on the wafer but also on the chamber walls. The resultant film formed on the chamber walls absorbs some of the radiant energy emitted from the heating lamps and thereby locally increases the temperature of the chamber walls. As a result, process gases deposit on the chamber walls at an increasing rate, thereby creating a "snowball" effect. It is therefore critical, in a radiantly heated CVD chamber, that the walls be kept meticulously clean. This requires that the walls be etched frequently, sometimes even after every run. Cleaning the walls typically takes between 2 to 3.5 minutes after depositing an epitaxial layer, and up to one hour after depositing polysilicon used in sealing the backside of silicon wafers. Such long cleaning times result from the relatively slow etchant rates associated with the warm walls of the chamber (which are designed to transmit heat). Since the entire cycle time in warm wall CVD systems may be between 5-10 minutes, cleaning the walls accounts for a significant portion of the cycle time.

Another factor affecting the throughput of such CVD chambers is the deposition rate of the process gases. Chambers that are optimized for deposition rates can decrease the deposition time required for a single wafer by as much as 25%.

Additionally, lamp failure (and the maintenance related thereto) and a required wet etching of the quartz chamber walls of such CVD systems adversely affect reliability and uptime. Note that wet etching requires disassembling the CVD system so that the quartz walls may be submerged in a wet etch bath.

Temperature control of the wafer is imperative for the deposition of uniform layers. The above described deposition of process gases on the chamber walls of lamp heated systems can occur within a single run and may affect the temperature uniformity within a run. Thus, cleaning the chamber walls after each wafer run may be ineffective in preventing non-uniformities resulting from deposition of process gases on the chamber walls.

Achieving a constant and uniform temperature across a wafer is further complicated by variations in the emissivity of the wafer. Since a wafer's emissivity depends in part upon the surface material of the wafer and upon temperature, accurately calibrating a reactor so as to bring the wafer to a constant and uniform temperature may be difficult.

An optimum CVD system should be able to operate at both atmospheric and reduced pressures. Reduced pressure operation requires a chamber design able to withstand the physical stresses of a lower pressure processing environment, i.e., a vacuum chamber. On the other hand, optimum designs for wafer processing may require a process gas flow channel having a narrow profile. This narrow profile optimizes process gas flow to the wafer by facilitating a maximum velocity flow of process gas across the wafer while minimizing the mass transfer boundary layer. In addition to having a narrow profile, chambers designed for optimum processing typically have simple non-convoluted surfaces so as to minimize vortices and backflow, to minimize dead spots that may promote deposition on the chamber walls, and to allow etching gases employed to clean the chamber walls to quickly reach the chamber walls. Unfortunately, such flat-topped quartz or graphite process chambers cannot easily sustain a pressure gradient across their walls. Chambers capable of withstanding such pressure differences typically are either of a fuller shape, such as a bell or globe structure, and therefore not only compromise optimum gas flow across the surface of the wafer but also do not facilitate an efficient cleaning of the chamber walls. Another approach is to incorporate structural reinforcement elements on the chamber walls. Unfortunately, such elements hamper the uniform transmission of radiant energy to the wafer. As a result, single chamber CVD designs suitable for reduced pressure operation typically compromise processing considerations such as process gas flow or thermal uniformity in order to increase structural integrity.

SUMMARY

A CVD reactor is disclosed herein which overcomes the problems discussed above. In accordance with the present invention, a CVD reactor includes a reaction chamber contained within a pressure vessel, where the pressure vessel and the reaction chamber are designed specifically for their intended purposes. The pressure vessel is, in one embodiment, bell-jar shaped to sustain a pressure gradient across its walls, and the pressure within the reaction chamber equalizes with the pressure within the pressure vessel. The reaction chamber houses a wafer to be processed therein and is contained entirely within the pressure vessel and, thus, does not have to be designed to withstand pressure forces across its walls. Accordingly, the reaction chamber is designed exclusively for optimized process or reactant gas flow, as well as cleaning and etching gas flow, within the reaction chamber. In some embodiments, the reaction chamber is of a parallel-plate shape such that the dimension of the reaction chamber perpendicular to the surface of the wafer is of a minimal height. The reaction chamber is substantially isolated from the pressure vessel such that process gases present within the reaction chamber are precluded from contacting the walls of the pressure vessel. In one embodiment, this isolation is achieved by maintaining a gas pressure in the volume between the pressure vessel and the reaction chamber slightly above the pressure of the gases in the reaction chamber. The gas in the volume is selected so as not to deposit on or react with the pressure vessel walls. In this manner, process gases are prevented from depositing on the walls of the pressure chamber.

In some embodiments, the reaction chamber approximates a black-body cavity encapsulating the wafer, thereby allowing the temperature of the wafer to be determined by measuring the temperature of the walls of the reaction chamber.

In some embodiments, the reaction chamber is heated by RF (radio frequency) induction coils positioned on the external periphery of the pressure vessel. The RF energy produced by the coils passes through the quartz walls of the pressure vessel to a graphite heating element (reaction chamber) which thereby heats the wafer. This RF energy passes through the quartz walls even in those embodiments in which a thin silicon layer is formed on the walls of the reaction chamber. Thus, heat transferred to the wafer is not dependent upon the thickness of deposited layers formed on the walls of the reaction chamber.

In other embodiments, the RF induction coils positioned below a susceptor holding the wafer heat the wafer and any adjacent reactor components. Process gases are thereby pre-heated as they pass through these components prior to entering the reaction chamber. A more uniform deposition is possible with the pre-heated process gases than deposition with cooler gases. In addition, process gases and feed gases, which direct the flow of the process gases within the reaction chamber, are injected into the reaction chamber via multiple independent slots. By adjusting the flow rates for each type of gas, deposition rates across the wafer can be better controlled for increased uniformity.

BRIEF DESCRIPTION OF THE DRAWINGS

Use of the same reference numbers in different figures indicates similar or like elements.

DETAILED DESCRIPTION

The operation of embodiments of the present invention will be discussed below in the context of the deposition of an epitaxial layer on a wafer. It is to be understood, however, that embodiments in accordance with the present invention may be used to deposit or grow any suitable material, such as polysilicon or gate oxide, respectively, on a wafer while still realizing the advantages of the present invention.

Figure 1:
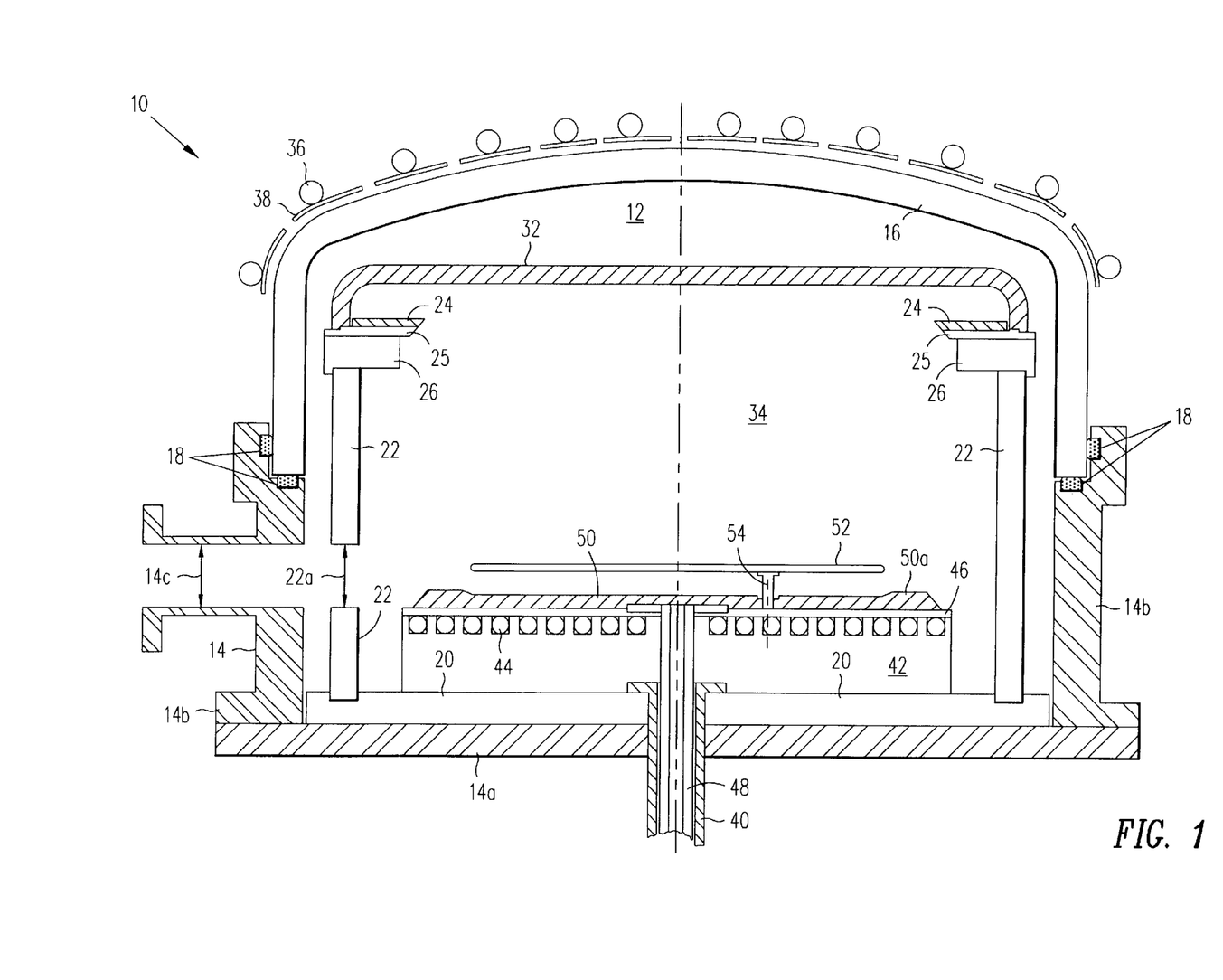
FIG. 1 is a cross-sectional view of a CVD reactor in accordance with one embodiment of the present invention, where the susceptor is in a lowered position to allow for loading of the wafer.
Figure 2:
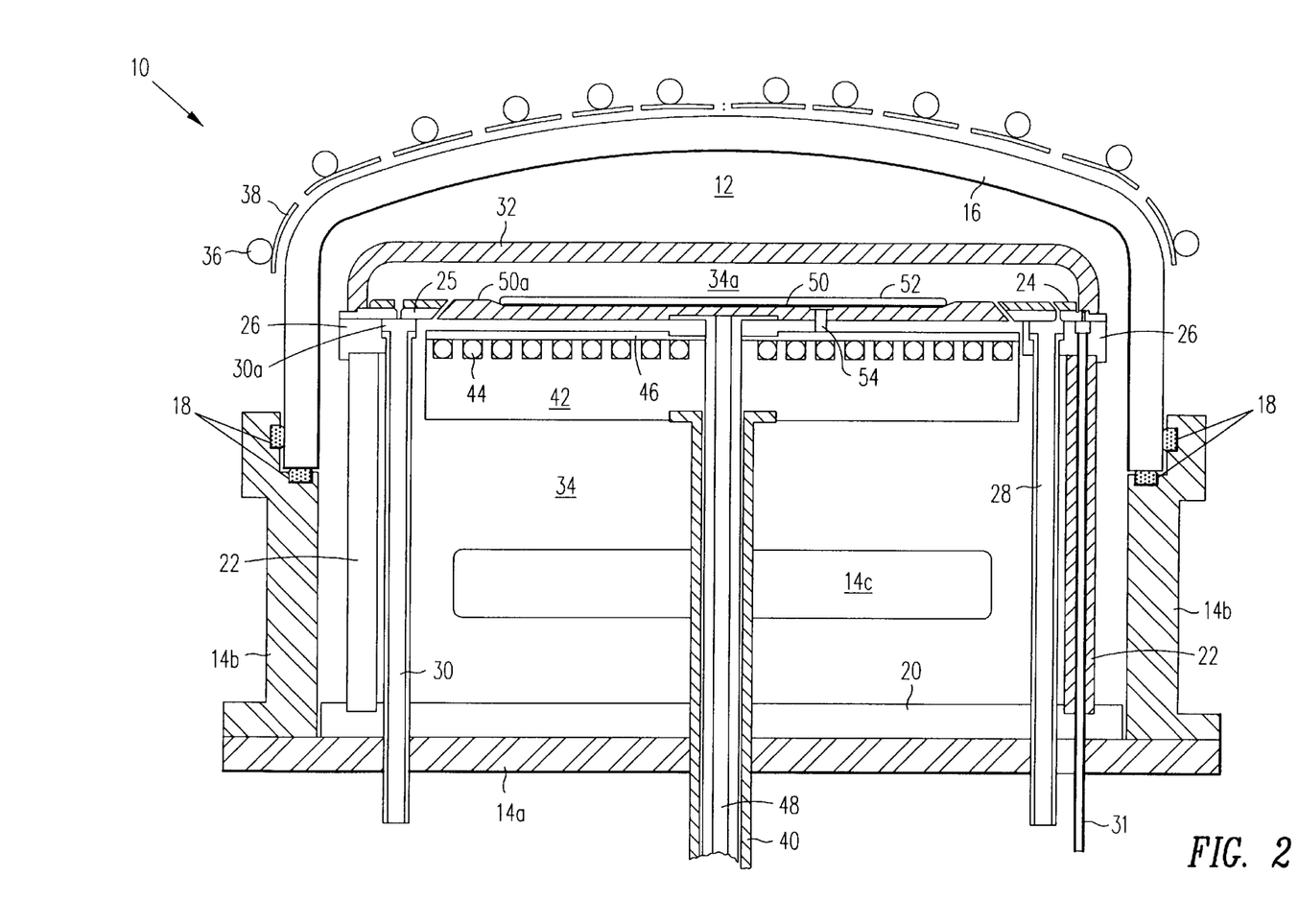
FIG. 2 is a cross-sectional view of the CVD reactor of FIG. 1 taken from a perspective perpendicular to that of FIG. 1, where the susceptor is in a raised position to allow for processing of the wafer.

Referring now to FIGS. 1 and 2, where common parts are denoted with the same numerals, a chemical vapor deposition (CVD) reactor 10 includes a pressure vessel comprised of a bell jar 16 and a stainless steel cylindrical outer housing 14 having a base plate 14a and a side wall 14b. Bell jar 16 is preferably opaque quartz and is removably attached to outer housing 14. Side wall 14b is securely attached to base plate 14a and is attached to and pressure sealed with bell jar 16 via O-rings 18. A quartz plate 20 is mounted onto base plate 14a. The pressure vessel formed by elements 14 and 16 encloses volumes 12 and 34 which can be at a reduced pressure.

A cylindrical inner housing 22 preferably constructed of opaque quartz is positioned within the pressure vessel formed by elements 14 and 16 and mounted onto quartz plate 20. A first ring plate 24 preferably made of silicon carbide overlies a second ring plate 25 made of quartz which is mounted onto a spacer ring 26 which, in turn, is mounted onto inner housing 22, as shown in FIG. 1. Referring to FIG. 2, ring plates 24, 25 and spacer ring 26 each have one or more aligned openings through which one or more associated injection ducts 28 and exhaust ducts 30 pass (only one injection duct 28 and one exhaust duct 30 are shown for simplicity). Additional aligned openings are formed in ring plates 24, 25 and spacer ring 26 through which one or more associated injection ducts 31 pass. A dish 32 is mounted onto the upper surface of second ring plate 25. Dish 32, which is preferably graphite and has a coating of silicon carbide provided on the outer surface thereof, is in intimate contact with second ring plate 25. As shown in FIG. 1, aligned openings 14c and 22a formed respectively in outer housing 14 and inner housing 22 allow a mechanical robot arm of well known design (not shown for simplicity) to insert and remove a wafer to and from the interior of reactor 10. A valve (not shown) is provided within opening 14c to isolate the inside of reactor 10 from the environment external to reactor 10.

A plurality of water-cooled, copper induction coils 36 are provided on an outside surface of bell jar 16. The turns of coils 36 may be electrically isolated from one another by non-conductive separators (not shown) such as, for example, quartz or ceramic or any appropriate material or combination of materials having the desired electrical properties. In this manner, coils 36 do not interact with one another. This also minimizes the tendency to arc or form plasmas. Diffusion plates 38 support copper coils 36 and also shape the RF field generated by copper coils 36 and result in a more uniform heating of reactor 10. In the preferred embodiments, induction coils 36 are grouped into three independently controlled concentric heating zones to allow for the uniform heating of a wafer. Of course, a different number of controlled heating zones may be employed if so desired. The temperature of the exterior of copper coils 36 should be kept below the melting point of copper coils 36.

A longitudinal tube 40 preferably made of quartz has an upper end coupled to a circular quartz housing 42 having a plurality of induction coils 44 therein and has a lower end operatively coupled in a conventional manner to an electrically controllable lift motor (not shown) which raises and lowers tube 40 and housing 42. In some embodiments, coils 44 are similar in construction to coils 36. Preferably, coils 44 are grouped in three independently controllable concentric heating zones, although a different number of controllable heating zones may be used if desired, and are electrically isolated from one another in a manner similar to that described above with respect to coils 36. A silicon carbide layer 46 provided on the top surface of housing 42 serves as a heat conductor between coils 44 and a circular graphite susceptor 50.

Positioned within tube 40 is a rotatable quartz longitudinal shaft 48 having an upper end coupled to susceptor 50 upon which a wafer 52 to be processed rests. The lower end of shaft 48 is operatively coupled in a conventional manner to an electrically controllable drive motor (not shown) which allows for susceptor 50, and thus wafer 52, to be raised, lowered, and rotated. Concentric tube 40 and shaft 48 pass through housing 42 via a circular opening at the center thereof.

Figure 3A:
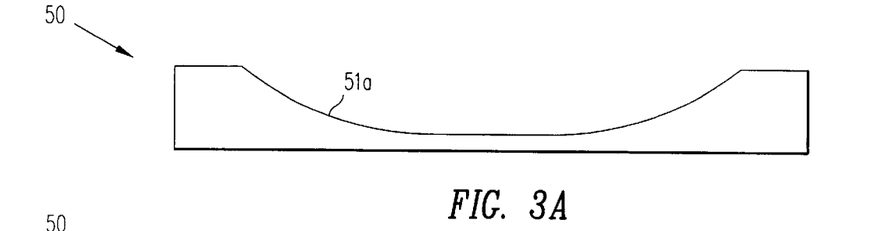
FIGS. 3A and 3B are cross-sectional views of wafer susceptors in accordance with embodiments of the present invention.
Figure 3B:
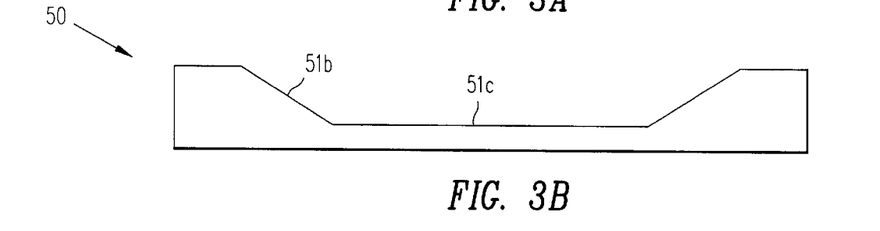

A portion of the top surface of susceptor 50 is recessed such that a minimum number of points along the outer edge of wafer 52 need be in intimate contact with susceptor 50 while wafer 52 rests thereon, thereby minimizing conductive heat transfer between susceptor 50 and wafer 52. In some embodiments, susceptor 50 has a dish-shaped cavity 51a formed therein, as shown in FIG. 3A, while in other embodiments the recessed portion of susceptor 50 preferably has an angled wall 51b sloping down to a linear recessed surface 51c, as shown in FIG. 3B. The susceptor shown in FIG. 3B is preferred since linear surface 51c allows for a more uniform spacing between susceptor 50 and a wafer than does the dish-shaped cavity 51a of susceptor 50 shown in FIG. 3A.

When resting on susceptor 50 as shown in FIG. 2, the bottom surface of wafer 52 is approximately 3–5 mils above the top surface of susceptor 50. The top surface of wafer 52 should be substantially flush with the top surface of the outer lip 50a of susceptor 50. For example, in some embodiments the top surface of wafer 52 can be within ±80 mills of the top surface of outer lip 50a of susceptor 50 and can be considered substantially flush. Susceptor 50 has three openings formed therein through which three quartz or silicon carbide pins 54 protrude so as to, when desired, lift wafer 52 off susceptor 50 (only one of pins 54 is shown in FIG. 1 for simplicity).

Wafer 52 is loaded onto pins 54 via a mechanical robot (not shown) through openings 14c and 22a. The lift motor is operated to raise shaft 48 and susceptor 50. Susceptor 50 gently lifts wafer 52 off pins 54 and cradles wafer 52 in its recessed portion as described earlier with respect to FIGS. 3A and 3B. As the lift motor operation continues, housing 42 rises along with shaft 48 and susceptor 50. In this manner, wafer 52, susceptor 50 and housing 42 are elevated into the processing position shown in FIG. 2.

The top surface of ring plate 24 and the top surface of lip 50a of susceptor 50 should be in substantially the same plane. While some deviation in this co-planarity might be expected, the goal is to make these two surfaces as closely as possible in the same plane. In this manner, dish 32, ring plate 24, susceptor 50 and wafer 52 form a parallel-plate shaped reaction chamber 34a that approximates a black body cavity and, thus, minimizes temperature gradients across wafer 52. Chamber 34a isolates process or reactant gases used in processing wafer 52 from the pressure vessel while allowing pressure equalization between the pressure vessel and reaction chamber 34a. In some embodiments, a venturi-type system is used to control the pressure in chamber 34a independent of wafer fab facility scrubber pressures, thereby allowing specific types of wafer processing to be repeatable without varying scrubber or outside pressures. The venturi injects nitrogen into an exhaust (not shown). As the pressure changes in chamber 34a, nitrogen feed pressure to the venturi is adjusted to maintain the desired pressure.

Power is applied to induction coils 36 (FIGS. 1 and 2) along the outer surface of bell jar 16 and to induction coils 44 disposed within housing 42 to heat wafer 52 to a desired temperature. The RF energy emitted from coils 36 couples to dish 32 and is controlled to create a uniform temperature across dish 32, thereby heating wafer 52 from above. In a similar manner, RF energy emitted by coils 44 in housing 42 couples with susceptor 50, thereby heating wafer 52 from below. In one embodiment, three infrared (IR) sensors (not shown) arranged in a linear fashion outside and about the periphery of bell jar 16 are employed to determine the temperature of portions of dish 32 immediately above wafer 52 through three associated clear quartz windows (not shown) in bell jar 16. Three sets of aligned quartz windows (not shown) may be formed in housing 42 and layer 46 so that additional IR sensors positioned below base plate 14a may be employed to measure the temperature of portions of susceptor 50 immediately below wafer 52. Suitable IR sensors are commercially available from LAND Corporation of Bristol, Pa. Although IR sensors are preferred, other sensors may be employed herein without departing from the scope of the present invention.

Information indicative of temperature gradients across wafer 52 generated by the three IR sensors above wafer 52 is provided as feedback to a controller (not shown) which in response thereto adjusts the RF fields generated by each of the three independently controlled concentric zones of coils 36. In some embodiments, this controller may be a computer. In a similar manner, information indicative of temperature gradients across wafer 52 generated by the three IR sensors below wafer 52 is used by the controller (not shown) to adjust the RF fields generated by each of the three independently controlled zones of coils 44. In this manner, reactor 10 maintains wafer 52 at a controlled and uniform temperature. Note that in other embodiments, independently controllable concentric zones of coils 36 and coils 44 may be replaced by radiant energy sources, such as for instance conventional heat lamps.

Figure 4:
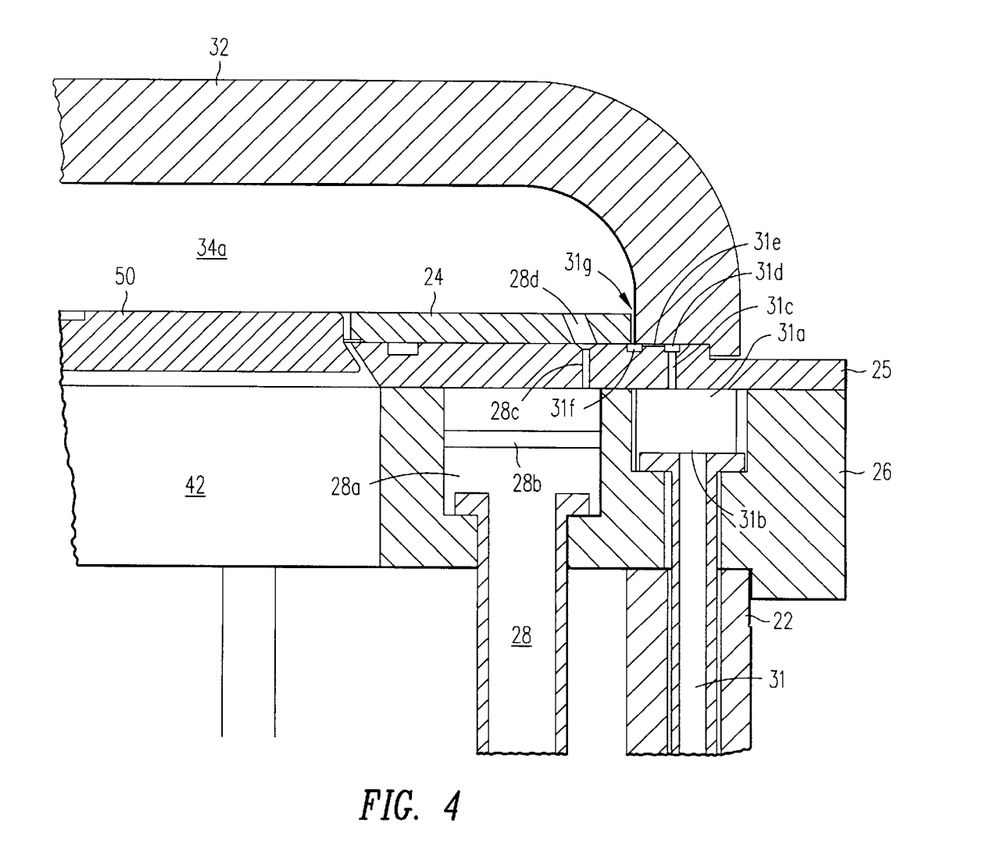
FIG. 4 is a cross-sectional view of a process gas injection system in accordance with the present invention.

Process gases are fed into reaction chamber 34a via three injection ducts 28 (only one shown in FIG. 2 for simplicity). In other embodiments, reactor 10 may include a greater or fewer number of such injection ducts 28. Referring also to FIG. 4 which shows in detail that portion of one of injection ducts 28 lying within spacer ring 26 and to FIGS. 5 and 6 which show cross-sectional views of elements 25 and 26, respectively, each of injection ducts 28 is connected to an associated injection plenum 28a formed within spacer ring 26. Spacer ring 26, which is preferably quartz, is heated as housing 42, dish 32, and susceptor 50 are heated by coils 36 and 44, as described above. As a result, process gases passing through injection ducts 28 and plenum 28a within spacer ring 26 are heated (typically between 700° C. and 900° C.) prior to entering reaction chamber 34a, with spacer ring 26 acting as a heating source. Because the process gases are pre-heated, problems caused when cool gases contact a wafer, such as non-uniform deposition of material on wafer 52, are eliminated, and a more uniform deposition is attainable.

Figure 7:
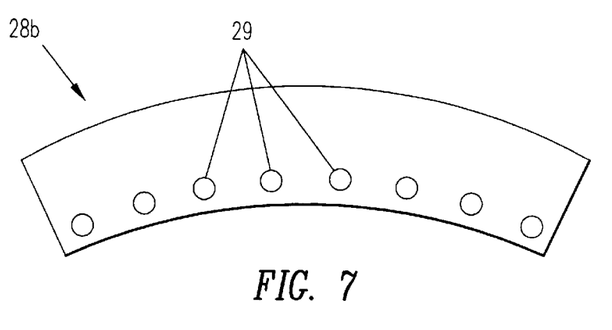
FIG. 7 is a top view of diffuser plate 28b of FIG. 4.
Figure 8:
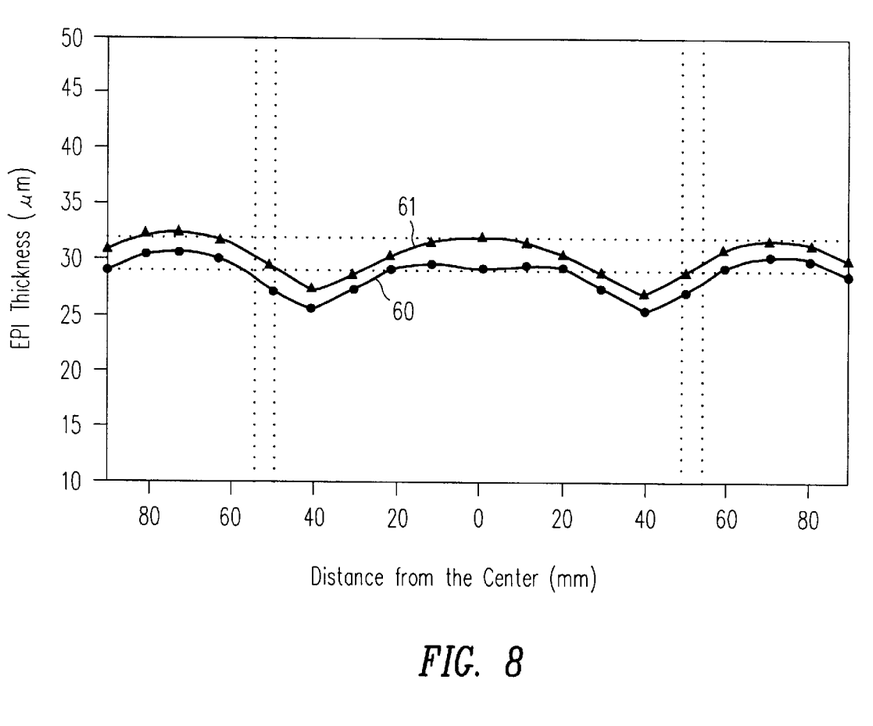
FIG. 8 is a graph illustrating the effect of the diffuser plate of FIG. 7 on epitaxial thickness.

Furthermore, plenum 28a contains a diffuser plate 28b having, in one embodiment, eight 0.04" diameter holes 29, formed therein, as shown in FIG. 7. The size and number of holes 29 within diffuser plate 28b may vary depending upon desired gas flow characteristics. If the size of holes 29 are decreased, process gases passing through injection ducts 28 and plenum 28a are more highly diffused prior to entry into reaction chamber 34a via slots 28c and 28d. As a result, the process gases are spread more uniformly throughout the plenum before entry into reaction chamber 34a, thereby allowing more uniform deposition on the wafer. In addition, by decreasing the number of holes 29, diffusion of process gases through diffuser plate 28b can be further increased. As high velocity process gases flow in a vertical direction through duct 28 and into plenum 28a, the process gases strike the bottom surface of diffuser plate 28b and are both slowed and diffused as they flow through plenum 28a and into reaction chamber 34a. The result is a more uniform epitaxial deposition across the center of the wafer, as shown in FIG. 8, which also shows that as process gases become more highly diffused, the epitaxial thickness becomes more uniform. Curve 60 represents the effect of a diffuser plate which diffuses the gases more than a diffuser plate of curve 61. In FIG. 8, the process gas flow rates are 20 L/min for each of the two slots ($28d_1$, and $28d_3$ in FIG. 5) associated with an outer portion of wafer 52 and 33 L/min for the slot ($28d_2$ in FIG. 5) associated with an inner portion of wafer 52, the outer and inner portions defined by the dotted lines in FIG. 8.

Figure 5:
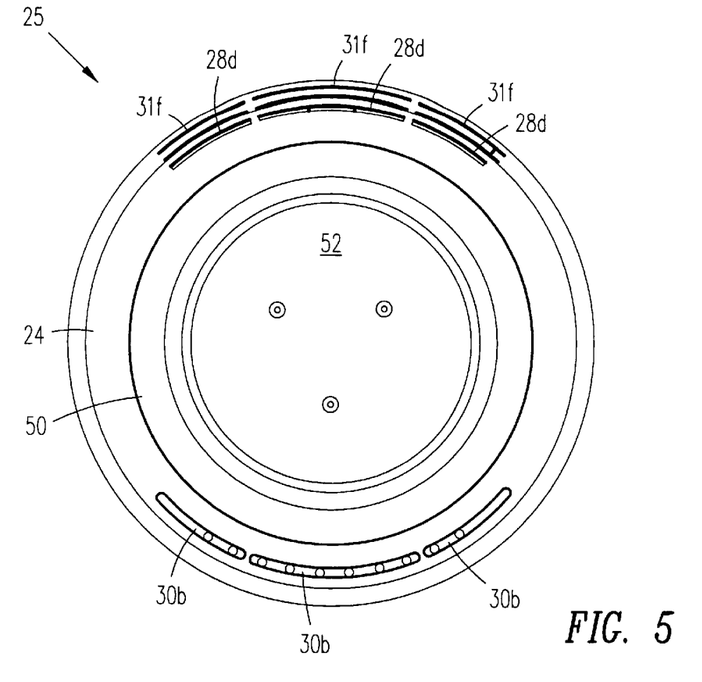
FIGS. 5 and 6 are top views of respective elements 25 and 26 of the reactor of FIGS. 1 and 2.
Figure 6:
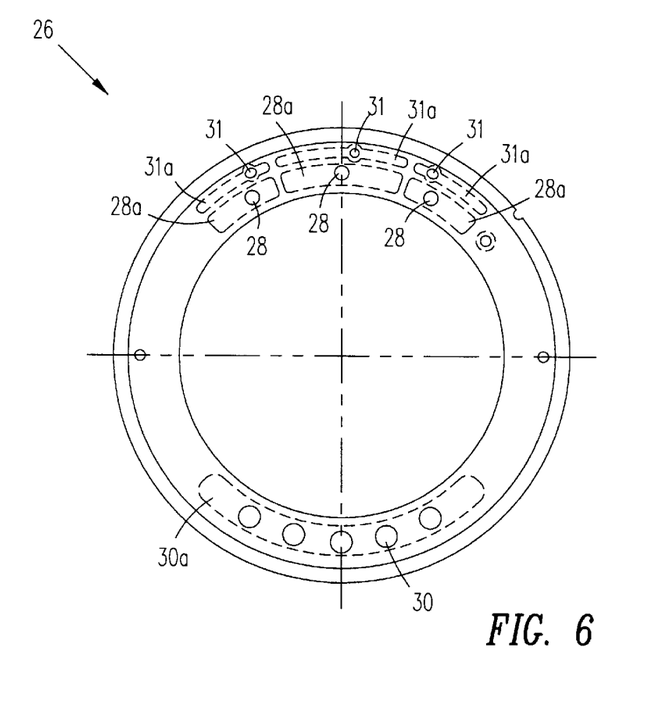

After entering the upper portion of plenum 28a via the holes formed in diffuser plate 28b, the process gases pass through connected vertical slot 28c and angled slot 28d and flow into reaction chamber 34a at some predetermined angle which is chosen to maximize uniform deposition of a selected material upon wafer 52. In some embodiments, slots 28c and 28d have a width of approximately 10 mils, while in other embodiments slots 28c and 28d may be replaced by a series of adjacent holes or other appropriate structure. In general, slots 28c and 28d are of the same shape, but slot 28d is typically wider. Also note that, as shown in FIGS. 5 and 6, each of plenums 28a and associated slots 28c and 28d may be of differing dimensions as required by the desired particular process gas flow characteristics. Changing the slot length changes the area of the wafer covered, and the slot size can be optimized for uniform deposition. In all of the present embodiments, the goal is for the above-described series of holes and slots to create sufficient back pressure so that the process gases forced into reaction chamber 34a have an even, lateral distribution around the interior periphery of chamber 34a.

Figure 9:
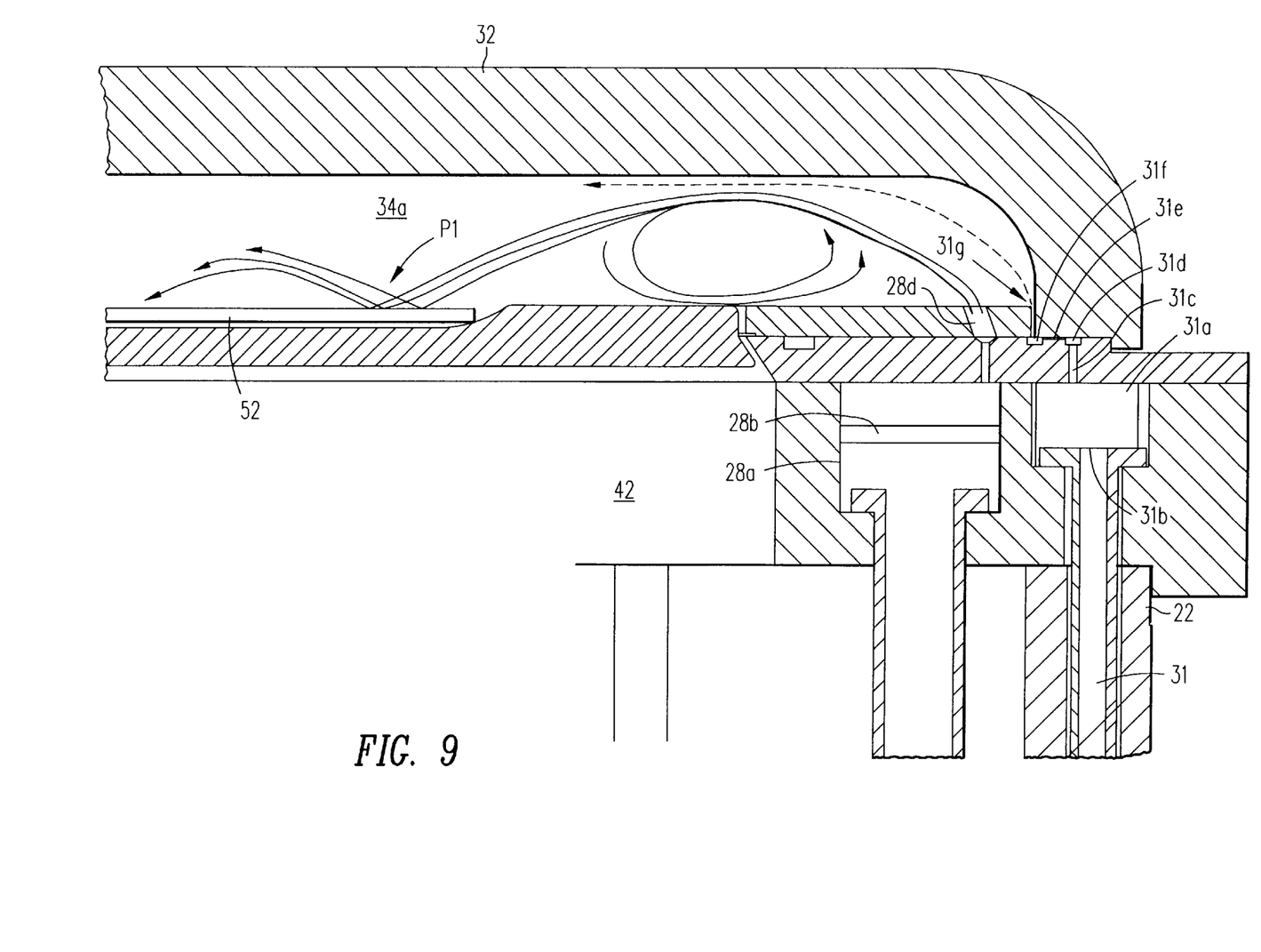
FIG. 9 is a cross-sectional view of reactor 10 illustrating gas flow patterns characteristic thereof.

Referring to FIG. 9, during processing of wafer 52, hydrogen or any appropriate gas is pumped into reaction chamber 34a via three injection ducts 31 (only one shown for simplicity) lying within associated bore holes formed in housing 22. Each of ducts 31 is connected to an associated plenum 31a via a hole 31b formed within a bottom surface of plenum 31a. The hydrogen or other appropriate gas is partially diffused upon entering plenum 31a and is forced into a vertical channel 31c formed in second ring plate 25 and having a width of approximately 0.04 inches. The gas enters a first chamber 31d, passes through a horizontal channel 31e, and enters a second chamber 31f. The gas is forced from second chamber 31f into reaction chamber 34a via a vertical gap 31g between ring plate 24 and dish 32. In other embodiments, gap 31g is non-vertical and directed towards wafer 52 at an angle less than 90° from horizontal. Note that the precise dimensions of each of elements 31a–31g may vary depending upon desired process gas flow characteristics.

Figure 10:
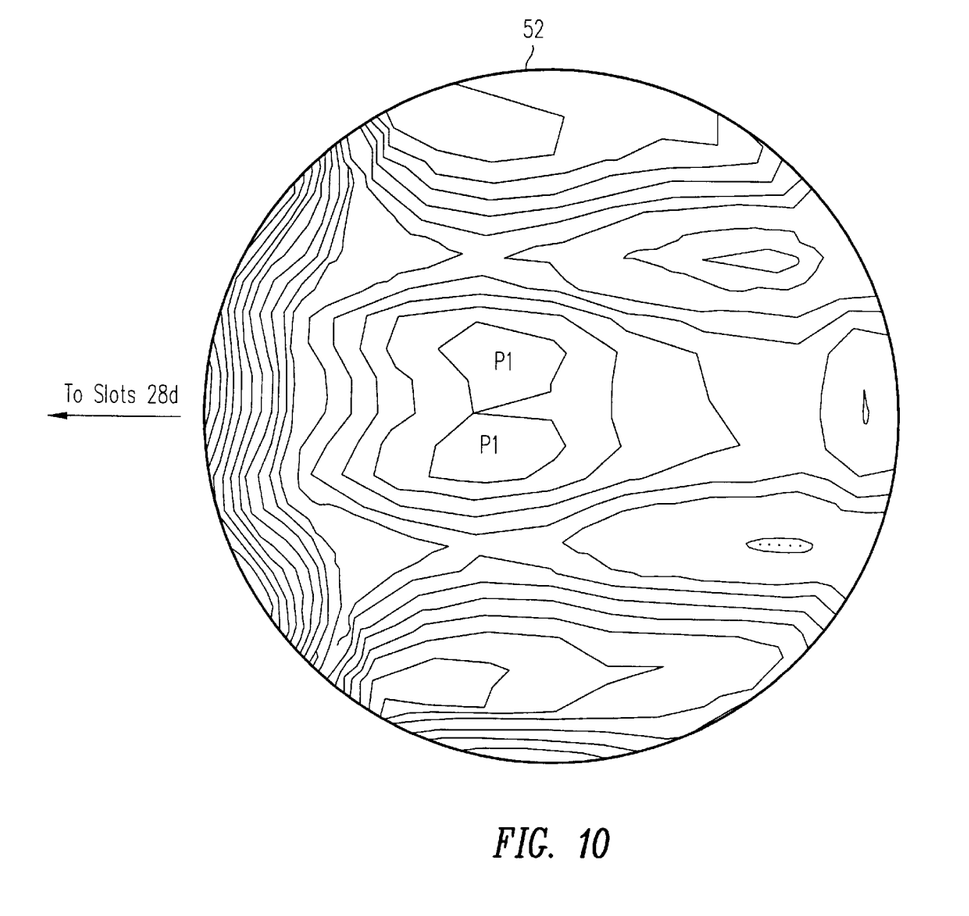
FIGS. 10 and 11 illustrate calculated deposition rates as a function of position on a wafer processed in accordance with the present embodiments.
Figure 11:
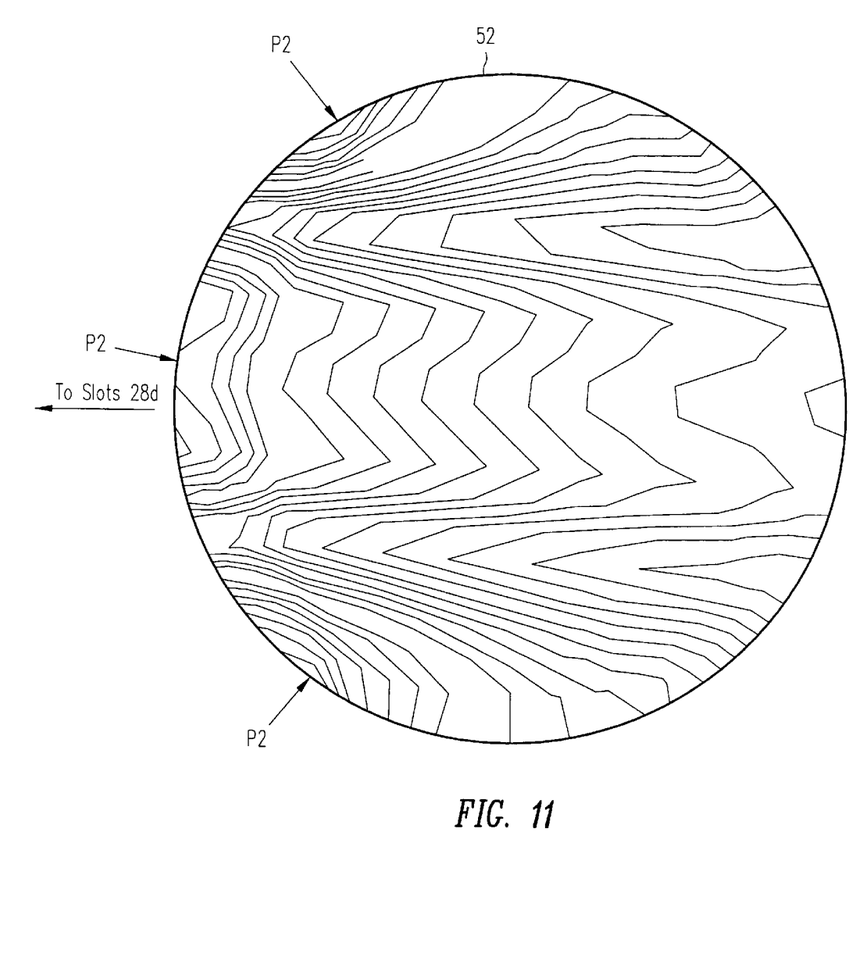

The flow of hydrogen or other appropriate gas interposed between the flow of process gases and dish 32 causes the flow of process gases from slots 28d to "turn over", as shown in FIG. 9, so as to flow through reaction chamber 34a parallel to the top surface of wafer 52. In FIG. 9, the gas flow of process gases is indicated in solid lines while the gas flow of hydrogen (or other appropriate gas) is indicated in dashed lines. Thus, the process gases enter reaction chamber at some predetermined angle and turn over so as to result in a maximum deposition on wafer 52 at a point P1. The process gas flow then evens out into a substantially horizontal gas flow across the top surface of wafer 52. This maximum deposition point P1 may be moved relative to the surface of wafer 52 by adjusting the flow rate of the hydrogen or other appropriate gas emitted from gap 31g, where increasing the flow rate of the hydrogen (or other appropriate gas) results in the maximum deposition point P1 being moved towards slot 28d. The deposition pattern may also be controlled by changing the angle of slots 28d. By way of example, FIGS. 10 and 11 illustrate the calculated deposition rate of the process gases as a function of position on wafer 52 under different operating conditions, where the contour lines represent equal deposition rates. In FIG. 10, hydrogen gas flows into reaction chamber 34a from gap 31g at a rate of approximately 10 L/min. The maximum deposition occurs in the two adjacent zones P1 in the center of wafer 52, where the deposition rate decreases when moving from the inner portions of wafer 52 to the periphery of wafer 52. In FIG. 11, hydrogen gas flows into reaction chamber 34a from gap 31g at a rate of approximately 70 L/min. In this case, maximum deposition occurs in zones P2 and generally decreases when moving across wafer 52 away from slots 28d. Note that the difference between the deposition patterns shown in FIGS. 10 and 11 is due to the difference in flow rates of the hydrogen gas, where increasing the flow rate of the hydrogen gas moves the recirculation flow towards slots 28d. Furthermore, by controlling the hydrogen gas flow rates individually for each of the three gaps 31g, the point of maximum deposition rate can be moved in three different zones.

Figure 12:
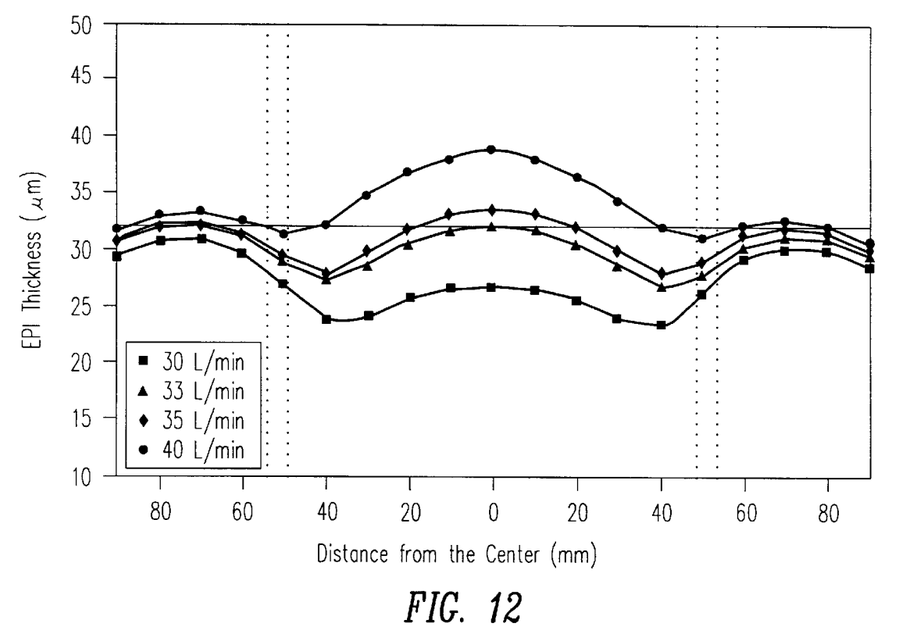
FIGS. 12 and 13 are graphs illustrating the effect of varying process gas flow rates on epitaxial thickness.
Figure 13:
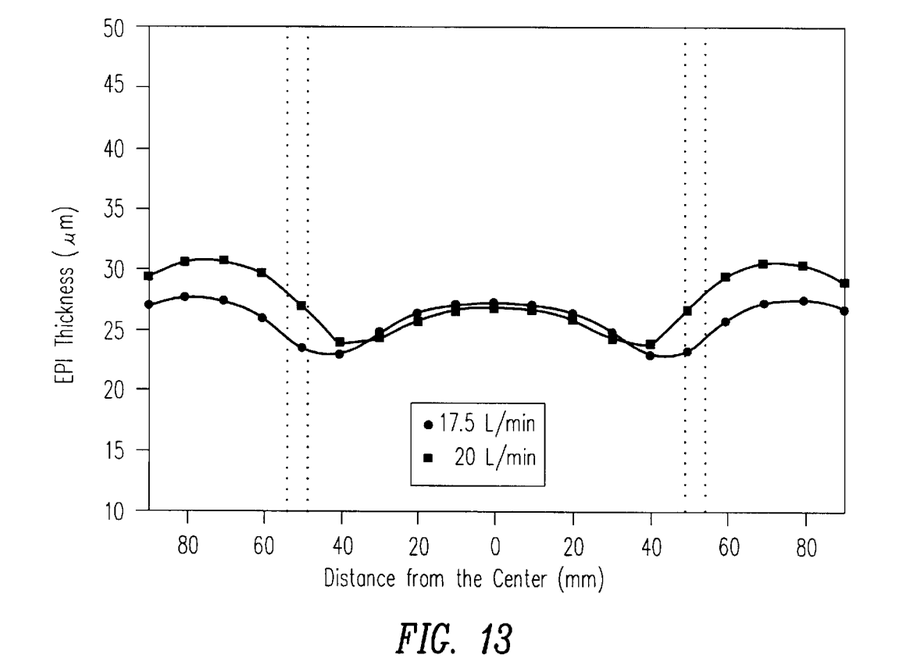

In addition to adjusting the hydrogen gas flow rates, the process gas flow rates from each of slots 28d can also be modified individually to change the deposition rate across different portions of wafer 52. By increasing the flow rate in the center one of slots 28d (slot $28d_2$ in FIG. 5) while keeping the flow rates in the outer ones of slots 28d (slots $28d_1$ and $28d_3$ in FIG. 5) constant, deposition rates in a center portion of wafer 52 can be increased. Similarly, by increasing the flow rates in outer slots $28d_1$ and $28d_3$ while keeping the flow rate in center slot $28d_2$ constant, deposition rates in outer portions of wafer 52 can be increased. FIGS. 12 and 13, based on measured experimental data, show that the thickness of a silicon epitaxial layer on the center and outer portions of a wafer can be adjusted by changing process gas flow rates in the center and outer ones of slots 28d, respectively. In FIG. 12, the flow rate of process gas in each of the outer ones of slots 28d is kept constant at 20

L/min, while in FIG. 13, the flow rate of process gas in the center one of slots 28d is maintained at 30 L/min. Process gases include hydrogen with a silicon source (i.e., trichlorosilane, dichlorosilane, or silane) and a dopant gas (i.e., diborane, phosphine or arsine). In both cases, susceptor 50 is heated to 1100° C. and dish 32 is heated to 1180° C. for 8 minutes of epitaxial deposition on a 200 mm diameter wafer.

The compact gas injection system described above allows process gases to be evenly distributed close to the surface of wafer 52 without requiring a long entry channel in reaction chamber 34a, thereby allowing reaction chamber 34a to be more compact without adversely affecting desired gas flow characteristics. Also note that none of the above elements which facilitate gas flow into reaction chamber 34a, such as ring plate 25, spacer ring 26, and injection ducts 28 and 31, protrude into heated portions of reaction chamber 34a where film deposition may occur, thereby preventing unwanted film deposition thereon. Further, the flow of hydrogen gas into reaction chamber 34a from injection duct 31 minimizes unwanted deposition of the material being deposited on wafer 52 on interior surfaces of dish 32. In preferred embodiments, gas flow rates are controlled so that the location of the maximum deposition rate, e.g. zones P1 or P2, counters any reactant depletion effect on wafer 52. In this manner, the rotation of wafer 52 may result in uniform deposition rates across the surface of wafer 52.

This gas injection system is in marked contrast to conventional CVD reactors such as those available from Applied Material and ASM in which the process gases are introduced in a horizontal flow pattern from the side of the chamber. Such conventional systems therefore require a long entry channel to achieve a uniform gas flow distribution across the chamber. Further, the long entry channel in these systems is typically within the heated portion of the chamber, thereby resulting in additional unwanted deposition upon interior surfaces of the chamber. Embodiments of this invention, on the other hand, allow for process gases to enter reaction chamber 34a at some predetermined angle through gap 28d. Dish 32, together with the flow of hydrogen or appropriate gas from gap 31g, redirects the process gas flow to substantially horizontal. In this manner, a uniform flow of process gases across the surface of wafer 52 is ensured while advantageously minimizing the entry length.

During processing, the drive motor causes wafer 52 to rotate, usually at speeds between 10 and 40 rpm. Referring back to FIGS. 2, 5, and 6, process gases are removed from reaction chamber 34a by flowing into a plurality of slots 30b which are connected to exhaust plenums 30a. Each of exhaust plenums 30a is connected to an associated exhaust tube 30. Of course, in other embodiments reactor 10 may employ different exhaust mechanisms, including employing a greater or fewer number of exhaust plenums 30a. The remaining portion of chamber 34 which lies substantially below housing 42 may be purged of process gases leaking thereto from reaction chamber 34a using for instance hydrogen or HCl gas. Hydrogen is compatible with suitable process gases and HCl is effective in removing process gas depositions from areas of chamber 34 lying substantially underneath housing 42.

Reactor 10 processes wafers at temperatures which may exceed approximately 1100° C. Applicants have determined that in order to avoid slip when removing wafer 52 from reactor 10, the wafer 52 should be cooled in a controlled and uniform manner to between approximately 750–950° C. before the mechanical arm (not shown) removes wafer 52 through openings 14c and 22a. Since the throughput of reactor 10 is affected by the time required to cool wafer 52 from approximately 1100° C. or higher to approximately 800° C., it is advantageous to cool wafer 52 as quickly as possible in a uniform manner.

Immediately after processing wafer 52 in reaction chamber 34a, dish 32, wafer 52 and susceptor 50 are at approximately the same temperature, i.e., the reaction temperature. Power applied to coils 36 is maintained such that the temperature of dish 32 remains at the reaction temperature. The drive motor is activated to lower housing 42 and susceptor 50, respectively, towards quartz plate 20. As housing 42 and susceptor 50 are lowered away from dish 32, wafer 52 begins to cool. Since the rate of heat radiation or loss increases when moving radially outward from the center to the outer periphery of wafer 52, power levels applied to the three independently controllable concentric zones of coils 44 are manipulated to compensate for this non-uniform heat loss by causing susceptor 50 to transfer more heat from its outer portions than from its inner portions, thereby facilitating a uniform cooling of wafer 52. As the temperature of wafer 52 approaches approximately 800° C., slip problems become much less significant. As susceptor 50 nears the bottom of chamber 34, power to coils 44 is reduced, and susceptor 50 is brought into intimate contact with silicon carbide layer 46 of housing 42. Housing 42 has formed therein three holes (not shown) into which pins 54 slide as susceptor 50 is brought into intimate contact with housing 42 so that wafer 52 rests on susceptor 50 while susceptor 50 is in intimate contact with layer 46.

During this cooling process, heat is conductively transferred from wafer 52 to susceptor 50, which in turn conductively transfers heat to layer 46 of housing 42. Layer 46 disperses heat therefrom to water circulating within coils 44. In this manner, wafer 52 may be cooled from a reaction temperature of approximately 1100° C. to approximately 800° C. in less than 1 minute. Conventional control algorithms may be employed to ensure that power provided to each of the zones of coils 36 and 44 is managed in a manner so as to result in raising and lowering the temperature of wafer 52 uniformly across the wafer from the center to its outer periphery, maintaining wafer 52 at a constant and uniform temperature during processing, and cooling wafer 52 in a uniform manner.

When the temperature of wafer 52 reaches approximately 800° C., susceptor 50 is raised a sufficient distance so as to engage and lift pins 54 out of their associated holes formed in housing 42. Susceptor 50 is then rotated so that pins 54 are no longer aligned with their associated holes formed in housing 42 and then lowered into intimate contact with layer 46. The lower ends of pins 54 engage the top surface of layer 46 of housing 42 and thereby lift wafer 52 off susceptor 50, as shown in FIG. 1. The temperature of susceptor 50 is not allowed to fall below approximately 800° C., and dish 32 is maintained at the reaction temperature even when reloading wafers. By maintaining internal components of reactor 10 at predetermined minimum temperatures, the amount of heat required to bring these components back up to the reaction temperature is advantageously minimized, thereby saving valuable time and energy.

In preferred embodiments, wafers to be processed in reactor 10 are first processed in a pre-clean chamber (not shown). The native oxide on the surface of the wafer may be removed in the pre-clean chamber in less than approximately one minute. In some embodiments, this pre-clean chamber is configured to feed two of reactors 10. The pre-clean chamber may operate at lower temperatures so as to minimize the thermal budget associated therewith. After cleaning, the wafers are then transferred from the pre-clean chamber to one of reactors 10 via an isolated transfer chamber (not shown) by a robotic arm (not shown).

This separate pre-cleaning chamber structure is in marked contrast to conventional techniques in which the process chamber of the CVD reactor is used for both cleaning the native oxide off the wafer and for wafer processing i.e. the deposition of films onto the wafer. In cleaning the wafer in such conventional systems, the chamber and wafer are brought to a high temperature such as for instance 1160° or higher. Hydrogen gas is pumped into the chamber and reacts with the native oxide on the wafer surface and thereby removes the native oxide. The temperature of the chamber is then lowered to a desired processing temperature.

By providing a separate pre-cleaning chamber, embodiments in accordance with the present invention increase throughput since the process chamber does not have to double as a pre-cleaning chamber and may thus be continuously employed for processing wafers. Further, by performing pre-cleaning functions at temperatures substantially lower than 1160° C., embodiments in accordance with the present invention reduce the associated thermal budget. Of course, it should be noted that the pre-cleaning chamber is separate from the process chamber in present embodiments and is thus not used for film deposition. Therefore, the pre-cleaning chamber may be optimized for cleaning wafers.

After pre-cleaning, the mechanical arm inserts the wafer into reactor 10 through openings 14c and 22a and places the wafer in a radially-centered position with respect to susceptor 50 resting on pins 54. In this position, wafer 52 is approximately ¼ inch above the surface of susceptor 50. Recall that the temperature of susceptor 50 is approximately 800° C. from previous process runs. Thus, the wafer should experience a symmetrical heating pattern emanating from susceptor 50. In order to minimize slip, wafer 52 should be inserted into reactor 10 and into its appropriate position on pins 54 in less than approximately 1.5 seconds. Susceptor 50 is then raised so as to lift wafer 52 off pins 54, as described earlier, thereby quickly bringing the temperature of wafer 52 to approximately 800° C. As housing 42 and susceptor 50 are elevated towards dish 32, power levels applied to coils 44 and thus the RF energy emitted thereby are manipulated such that all portions of wafer 52 are brought to the reaction temperature in a uniform manner.

The dual-chamber structure of reactor 10 allows for superior performance over conventional CVD reactors that employ a single chamber which serves as both the pressure vessel and the reaction chamber. In such conventional CVD reactors, the chamber must be designed in such a manner so as to achieve not only a low pressure environment capable of withstanding the external atmospheric pressure but also an ideal flow of process gases. Since, as discussed earlier, the design considerations necessary to sustain a low pressure environment are not necessarily consistent with those necessary for optimizing process gas flow, the design of such single chamber CVD reactors undesirably requires compromising design considerations of both. That is, while a flat shaped chamber (i.e., one in which the dimension of the chamber perpendicular to the surface of the wafer is minimal) having a non-convoluted surface is desirable to optimize process gas flow, such flat structures are incapable of sustaining a low pressure environment without significant structural reinforcement. On the other hand, the ability to sustain low pressure environments compels a fuller globe-shaped chamber which, in turn, undesirably results in a wider flow channel for process gases. As noted above, a wide flow channel may adversely affect the process gas flow velocities and concentration gradients across the wafer. In sum, in addition to suffering from warm wall problems discussed above, the design of conventional single-chamber CVD reactors cannot be simultaneously optimized for both low pressure results and uniform process gas flow.

Thus, reactor 10 employs two separate chambers each of which is specifically designed for its intended purpose. The design of bell jar 16 is optimized to sustain a very low pressure therein without adversely influencing gas flow characteristics within reaction chamber 34a. Bell jar 16 is a domed-type structure as shown in FIGS. 1 and 2 which maximizes structural strength and thereby allows low pressures to be sustained therein. In preferred embodiments, bell jar 16 is approximately 10–20 mm thick and is capable of sustaining very low pressures, e.g. below 1E-8 Torr.

The ability to sustain low pressures improves the performance of reactor 10. Pattern shift and distortion are greatly reduced at low pressures. Further, when processing a wafer at low pressures, materials may be deposited thereon at lower temperatures which, in turn, helps prevent wafer slip, i.e., breaks along the lattice of crystalline silicon wafer, and lowers the associated thermal budget.

Reaction chamber 34a is contained entirely within and is at the same pressure as the pressure vessel and thus does not have to withstand a large pressure difference between its interior and exterior. Accordingly, reaction chamber 34a does not have to be of a domed shaped but may rather be of a geometry which allows for optimum gas flow across wafer 52. Accordingly, when wafer 52 is elevated to the processing position as described above and shown in FIG. 2, reaction chamber 34a is of a shape similar to that of a thin pancake and, by having a thin flow channel, advantageously allows for a maximum gas flow velocity through reaction chamber 34a.

Applicants have determined that reaction chamber 34a can be of a height of approximately ½ to ⅜ of an inch, as measured between wafer 52 and dish 32, in order to achieve a high process gas flow across wafer 52. However, other embodiments may have different height ranges for particular purposes. Reaction chambers having greater heights require a greater gas flow to maintain desirable gas velocity and may have slower deposition rates. On the other hand, reactions chambers having lower heights may cause depletion layer boundaries to merge, resulting in non-uniform depositions.

Isolating the process gases in reaction chamber 34a from the pressure vessel results in certain advantages. First, process gases used in the formation of various layers on wafer 52 are prevented from entering volume 12 and, thus, do not deposit on the walls of bell jar 16. As a result, it is not necessary to frequently clean the inner walls of bell jar 16, thereby saving time and reducing operating expenses. Further, since process gases do not deposit on the walls of bell jar 16, heat transfer efficiency through the walls of bell jar 16 in those embodiments which employ heating lamps rather than induction coils 36 is not adversely affected during wafer processing.

Second, the isolation of reaction chamber 34a from the pressure vessel allows reactor 10 to form not only thin epitaxial films but also thick epitaxial films on wafer 52. As mentioned above, process gases undesirably deposit on the walls of conventional radiantly warm wall CVD chambers during wafer processing. When depositing films greater than 100 microns thick on a wafer, significant deposition can occur on the warm walls. Silicon deposited on the quartz walls can absorb heat generated from radiant heat sources. This absorbed heat further increases the temperature of the quartz walls and thereby increases the rate at which silicon deposits on the quartz walls. Deposition rates on the reactor walls therefore increase while the wafer temperature, and thus the local rate of deposition on the wafer, decreases. In contrast, with the present invention, the thickness of any deposition coating on the inner surface of dish 32 does not influence the heat transfer therethrough. Hence, even a 100 micron thick layer deposited on the inner surface of dish 32 would not significantly affect the delivery of heat energy through induction coils 36 to wafer 52 through dish 32.

Positioning wafer 52 within a black body cavity (reaction chamber 34*a*) during processing is also advantageous in allowing for more accurate temperature measurements of wafer 52. Since wafer 52 quickly reaches thermal equilibrium with the walls of reaction chamber 34*a*, the temperature of wafer 52 may be determined by measuring the temperature of the exterior of the walls of reaction chamber 34*a*. Recall that the dual-chamber design of reactor 10 prevents unwanted deposition of process gases on surfaces which form volume 12. Thus, unlike the emissivity of wafer 52, the emissivity of the exterior of the walls of reaction chamber 34*a* is predictable during processing of wafer 52. In this manner, the temperature of wafer 52 may be determined independently of its changing emissivity, thereby allowing the temperature of wafer 52 to be determined with increased precision. This is in marked contrast to those conventional CVD reactors that attempt to directly measure the temperature of wafer 52, which can change as the layer of material deposits on the wafer.

Further, the simple shape of chamber 34*a*, as compared to other reaction chambers commonly used in other CVD reactors, allows for a quick and easy cleaning of chamber 34*a*. Indeed, Applicants have found that chamber 34*a* may be cleaned in less than 30 seconds using HCl. In contrast, it typically takes as much as 3 minutes to clean the chamber of a typical radiantly heated CVD reactor.

Note that although described above and illustrated in the drawings as employing RF heating coils, reactor 10 may in other embodiments employ other heating systems such as a radiant heating system while still realizing the advantages described above.

Figure 14:
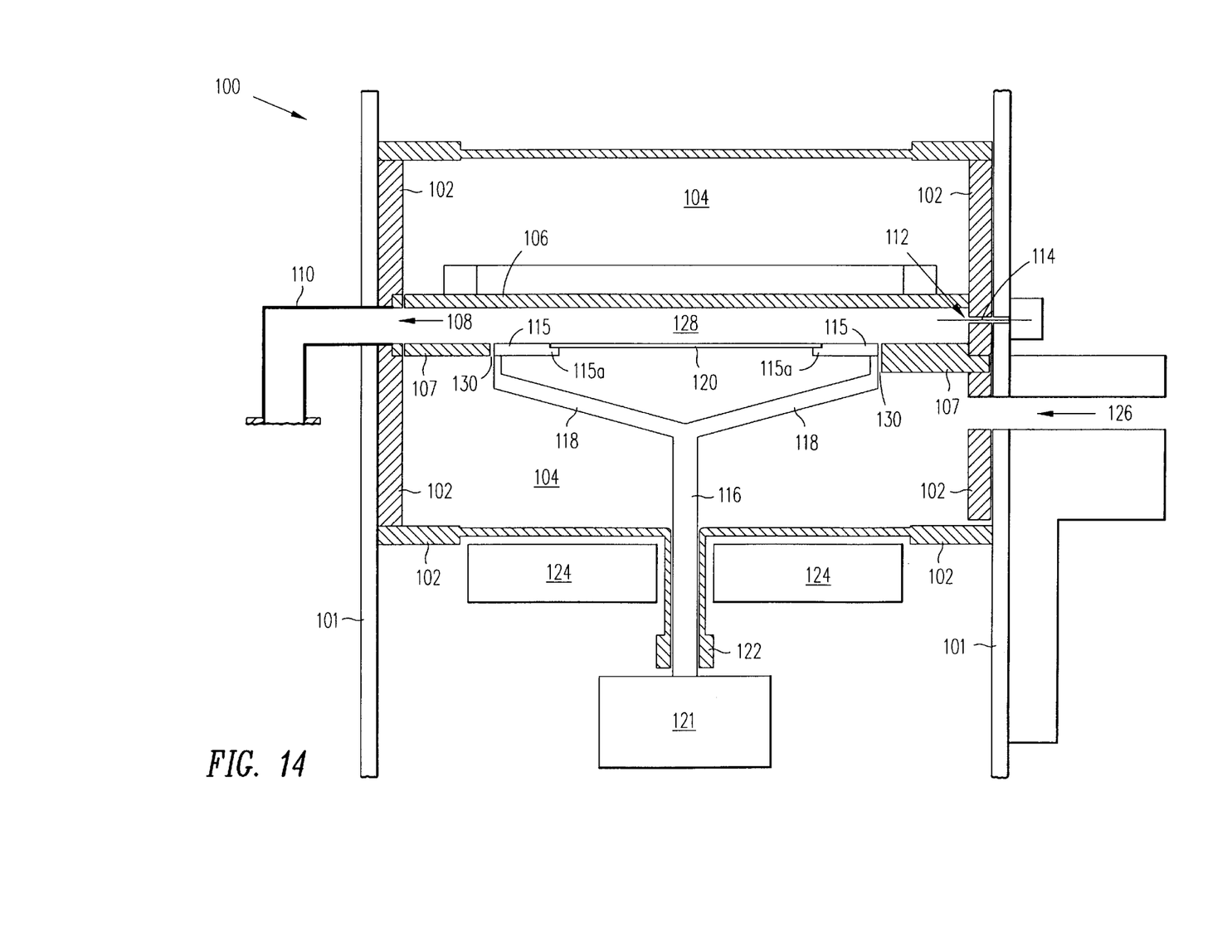
FIG. 14 is a cross sectional view along an axis of a cylindrical reactor in accordance with another embodiment of the present invention.
Figure 15:
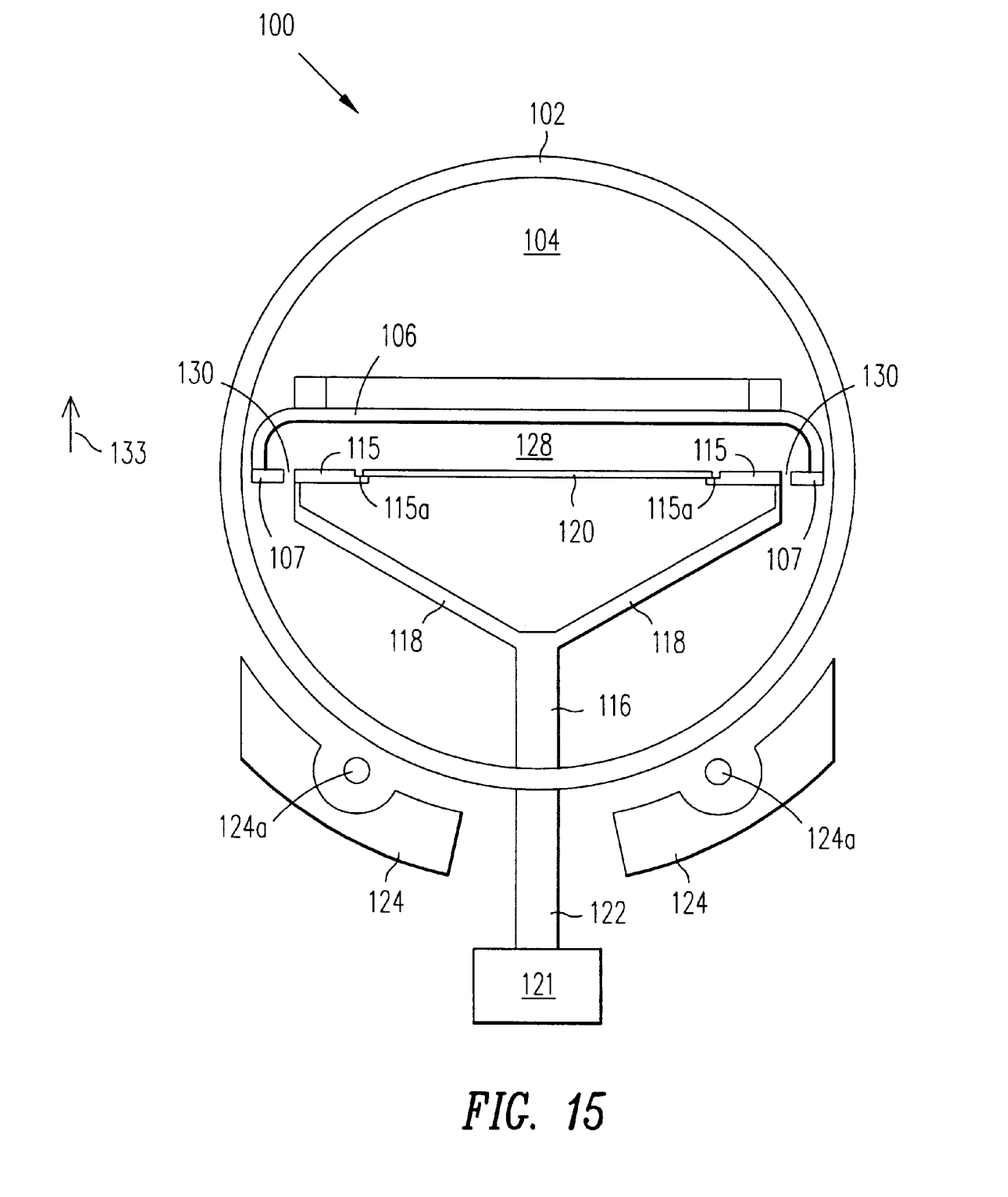
FIG. 15 is a cross-sectional view along a diameter of the reactor of FIG. 14.

Another embodiment in accordance with the present invention is shown in FIGS. 14 and 15. Reactor 100 includes a stainless steel frame 101 (shown only in FIG. 3 for simplicity) supporting a cylindrical clear quartz pressure vessel 102 that contains a low pressure environment 104. Within pressure environment 104 is positioned an inverted top plate 106 and a bottom plate 107 which is supported on a periphery thereof by body 102. Top plate 106 and bottom plate 107 are preferably either graphite or silicon carbide. Aligned openings 108 formed in respective vessel 102 and top plate 106 allow one or more exhaust tubes 110 to pass therethrough, while aligned openings 112 formed in respective body 102 and top plate 106 allow one or more process gas injection tubes 114 to pass therethrough.

A graphite support which includes a shaft 116 connected to three arms 118 is provided to position and rotate susceptor 115. A susceptor 115 preferably made of graphite is mounted onto arms 118 and supports a wafer 120. Susceptor 115 may have a recessed portion 115*a* and an open center, as shown in FIG. 14, or may be of a construction similar to that of susceptor 50 shown in FIGS. 3A and 3B. In either embodiment, susceptor 115 properly centers a wafer 120 within reactor 100 and also minimizes variations in the transfer of heat to wafer 120. Shaft 116 passes through an opening in vessel 102 and is operatively coupled in a conventional manner to a drive motor 121 via a casing 122 affixed to vessel 102, as shown in FIG. 15. Drive motor 121 may be of any well known suitable design capable of raising and lowering support 116 within vessel 102 and capable of rotating support 116 (and thus wafer 120) to speeds appropriate for CVD processing.

In one embodiment, a layer of quartz is provided on an inner surface of vessel 102 to insulate stainless steel frame 101 from heat energy emitted from lamp housings 124 positioned underneath vessel 102. In one embodiment, lamp housings 124 each include a plurality of arc-type argon lamps 124*a*. Lamps 124*a* do not have filaments and may thus be maintained in working condition more cheaply than can filament type lamps. A plurality of heat lamps (not shown) arranged in three independently controlled zones outside and about the periphery of vessel 102 in a well known manner indirectly heat wafer 120 via dish 106. These heat lamps arranged on the outer periphery of vessel 102, together with lamp housings 124, radiantly heat top plate 106, bottom plate 107, and susceptor 115 which, by approximating a black body cavity, heat wafer 120 in a uniform manner.

Wafer 120 is processed in reactor 100 as follows. Initially, support 116 is in a loading position (not shown) such that wafer 120 may be inserted into vessel 102 through an opening 126 formed in vessel 102 via a robotic arm (which is of a well known design and is thus not shown for simplicity). Drive motor 121 is operated so as to raise support 116 and wafer 120 into a processing position, as shown in FIG. 15. When in the processing position, top plate 106, bottom plate 107, wafer 120, and susceptor 115 form within pressure vessel 102 a reaction chamber 128 which, as mentioned above, approximates a black body cavity.

During processing of wafer 120, process gases are injected into reaction chamber 128 through one or more intake tubes 114 (FIG. 14) via suitable gas injection systems, such as the one described above or ones well known in the art. Reaction chamber 128, like reaction chamber 34*a* of reactor 10 (see FIGS. 1 and 2), has a narrow height dimension as defined by arrow 133 to ensure optimum flow of process gases within reaction chamber 128.

Power is applied to lamps 124*a* to indirectly heat wafer 120 to a desired reaction temperature. The black body cavity approximated by reaction chamber 128 allows for excellent temperature uniformity across the surface of wafer 120 using these lamps. In some embodiments, lamps 124*a* may be arranged into multiple independently controlled heating zones. In one embodiment, each of lamps 124*a* is rated at 150–200 kW so as to heat an area much larger than the surface area of wafer 120. In this manner, the entirety of wafer 120 will be within the "sweet spot" of the heated zone such that edge effects will be of minimum influence at the outer edge of wafer 120.

During processing, hydrogen gas or any other suitable gas is forced through spacing 130 into reaction chamber 128, using conventional means, to prevent any process gases from escaping reaction chamber 128 and flowing to areas underneath susceptor 115.

Note that reaction chamber 128 is entirely contained within, and separate from, volume 104 sustained by pressure vessel 102 such that process gases flowing within reaction chamber 128 during processing of wafer 120 will not come into contact with vessel 102. Thus, by providing separate reaction 128 and pressure 104 chambers, reactor 100 achieves advantages similar to those discussed above with respect to reactor 10. Of particular importance is that pressure vessel 102 and reaction chamber 128 may be independently designed to optimize their intended functions. Thus, vessel 102 may be optimized for strength to sustain a low pressure, while reaction chamber 128 may be designed to optimize the flow characteristics of process gases used to form layers on wafer 120. In this manner, reactor 100 achieves a superior performance over prior art reactors having a single chamber which must not only sustain low pressures but must also optimize gas flow characteristics. Further, process gases are prevented from contacting chamber wall 102 and thus do not deposit thereon. Preventing film deposition upon the walls of pressure vessel 102 results in savings in cleaning time, thereby increasing wafer throughput.

While particular embodiments of the present invention have been shown and described, it will be obvious to those skilled in the art that various changes and modifications may be made without departing from this invention in its broader aspects. Therefore, the appended claims encompass all such changes and modifications as fall within the true spirit and scope of this invention.

What is claimed is:

1. A gas injection system for injecting one or more process gases into a reaction chamber within which a wafer is processed, said gas injection system comprising:

one or more first slots formed in a first portion of the bottom surface of said reaction chamber; and one or more second slots formed in a second portion of the bottom surface of said reaction chamber, said one or more second slots being positioned intermediate said one or more first slots and a side wall of said reaction chamber;

wherein a first gas is injected into said reaction chamber in a direction toward said wafer through said one or more second slots and said one or more process gases are injected into said reaction chamber through said one or more first slots, said first gas serving to re-direct said one or more process gases into a flow pattern substantially parallel to a top surface of said wafer.

2. The gas injection system of claim 1, wherein said one or more first slots and said one or more second slots are formed on a same surface.

3. The gas injection system of claim 1, further comprising a heating source located adjacent said first slots, wherein said one or more process gases are pre-heated by said heating source before said one or more process gases enter said reaction chamber.

4. The gas injection system of claim 1, further comprising one or more diffuser plates located vertically to said one or more first slots, wherein said one or more diffuser plates diffuses said one or more process gases before said one or more process gases enter said reaction chamber.

5. The gas injection system of claim 4, wherein said one or more diffuser plates are located below said one or more first slots.

6. The gas injection system of claim 4, wherein said one or more diffuser plates each have a multiplicity of openings.

7. The gas injection system of claim 1, wherein said one or more process gases are injected into said reaction chamber through each of two or more of said first slots at a flow rate independent of the flow rate through the remaining two or more of said first slots.

8. The gas injection system of claim 1, wherein said first gas is injected into said reaction chamber through said each of said two or more of said second slots at a flow rate independent of the flow rate through the remaining said two or more of said second slots.

9. A method for injecting one or more process gases into a reaction chamber within which a wafer is processed, comprising the steps of:

forming one or more first slots in a bottom surface of said reaction chamber;

forming one or more second slots in another bottom surface of said reaction chamber, said one or more second slots being positioned intermediate said one or more first slots and a side wall of said reaction chamber;

injecting a first gas into said reaction chamber in a direction towards said wafer through said one or more second slots;

injecting said one or more process gases into said reaction chamber through said one or more first slots; and re-directing said one or more process gases into a flow pattern substantially parallel to a top surface of said wafer with said first gas.

10. The method of claim 9, wherein said one or more second slots are formed on a same surface as said one or more first slots.

11. The method of claim 9, further comprising the step of pre-heating said one or more process gases before said one or more process gases enter said reaction chamber.

12. The method of claim 9, further comprising the step of diffusing said one or more process gases before said one or more process gases enter said reaction chamber.

13. The method of claim 9, further comprising the step of forming one or more third slots vertical to each of said one or more first slots, wherein said one or more third slots diffuses said one or more process gases before said one or more process gases enter said reaction chamber.

14. The method of claim 13, wherein said one or more third slots are formed below each of said one or more first slots.

15. The method of claim 9, further comprising the step of adjusting a flow rate of said one or more process gases through each of two or more said first slots.

16. The method of claim 9, further comprising the step of adjusting a flow rate of said first gas through each of two or more said second slots.

17. A method for injecting one or more process gases into a reaction chamber within which a wafer is processed, comprising the steps of:

injecting a first gas into said reaction chamber in a direction towards said wafer from a first bottom portion of said reaction chamber;

injecting said one or more process gases into said reaction chamber from a second bottom portion of said reaction chamber; and re-directing said one or more process gases into a flow pattern substantially parallel to a top surface of said wafer with said first gas.

18. The method of claim 17, further comprising the step of pre-heating said one or more process gases before said one or more process gases enter said reaction chamber.

19. The method of claim 17, further comprising the step of diffusing said one or more process gases before said one or more process gases enter said reaction chamber.

20. The method of claim 17, further comprising the step of adjusting a flow rate of said one or more process gases through each of two or more first slots.

21. The method of claim 17, further comprising the step of adjusting a flow rate of said first gas through each of two or more second slots.

22. The method of claim 17, wherein said second bottom portion is located between said first bottom portion and a side wall of said reaction chamber.

* * * * *